United States Patent
Chan et al.

(10) Patent No.: US 9,048,261 B2
(45) Date of Patent: Jun. 2, 2015

(54) FABRICATION OF FIELD-EFFECT TRANSISTORS WITH ATOMIC LAYER DOPING

(75) Inventors: Kevin K. Chan, Staten Island, NY (US); Young-Hee Kim, Mohegan Lake, NY (US); Isaac Lauer, Mahopac, NY (US); Ramachandran Muralidhar, Mahopac, NY (US); Dae-Gyu Park, Poughquag, NY (US); Xinhui Wang, Poughkeepsie, NY (US); Min Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 529 days.

(21) Appl. No.: 13/198,255

(22) Filed: Aug. 4, 2011

(65) Prior Publication Data

US 2013/0032883 A1    Feb. 7, 2013

(51) Int. Cl.
    H01L 21/44     (2006.01)
    H01L 21/441    (2006.01)
    H01L 29/66     (2006.01)
    H01L 21/225    (2006.01)
    H01L 29/78     (2006.01)
    H01L 29/165    (2006.01)

(52) U.S. Cl.
    CPC ...... *H01L 29/66803* (2013.01); *H01L 21/2254* (2013.01); *H01L 29/665* (2013.01); *H01L 29/6653* (2013.01); *H01L 29/6659* (2013.01); *H01L 29/66636* (2013.01); *H01L 29/7833* (2013.01); *H01L 29/7848* (2013.01); *H01L 29/785* (2013.01); *H01L 29/165* (2013.01)

(58) Field of Classification Search
    CPC ............ H01L 21/3141; H01L 21/0228; H01L 21/28194; H01L 29/365; H01L 29/7788
    USPC .................. 438/663, 674, 761, 763
    See application file for complete search history.

(56) References Cited

U.S. PATENT DOCUMENTS

| | | | | |
|---|---|---|---|---|
| 8,361,895 | B2 * | 1/2013 | Lin et al. | 438/558 |
| 2005/0112817 | A1 * | 5/2005 | Cheng et al. | 438/219 |
| 2005/0173757 | A1 * | 8/2005 | Peake | 257/329 |
| 2005/0287779 | A1 * | 12/2005 | Lin et al. | 438/585 |
| 2008/0261412 | A1 * | 10/2008 | Yoon et al. | 438/785 |
| 2010/0065924 | A1 | 3/2010 | Lin et al. | |

(Continued)

OTHER PUBLICATIONS

Gary S. May, Fundamentals of Semiconductor Fabrication, 2004, John Wiley and Sons, pp. 134-136.*

(Continued)

*Primary Examiner* — Jerome Jackson, Jr.
*Assistant Examiner* — Paul Budd
(74) *Attorney, Agent, or Firm* — Tutunjian & Bitetto, P.C.; Louis J. Percello (57) ABSTRACT

Field effect transistors fabricated using atomic layer doping processes are disclosed. In accordance with an embodiment of an atomic layer doping method, a semiconducting surface and a dopant gas mixture are prepared. Further, a dopant layer is grown on the semiconducting surface by applying the dopant gas mixture to the semiconducting surface under a pressure that is less than 500 Torr and a temperature that is between 300° C. and 750° C. The dopant layer includes at least $4 \times 10^{20}$ active dopant atoms per $cm^3$ that react with atoms on the semiconducting surface such that the reacted atoms increase the conductivity of the semiconducting surface.

13 Claims, 10 Drawing Sheets

(56) References Cited

U.S. PATENT DOCUMENTS

2010/0270590 A1* 10/2010 Ahn et al. .................. 257/190
2011/0147840 A1 6/2011 Cea et al.

OTHER PUBLICATIONS

S.M. Sze, Physics of Semiconductor Devices, 1981, John Wiley and Sons, Second Edition, pp. 32-33.*

Kaneko, A., et al. "Sidewall Transfer Process and Selective Gate Sidewall Spacer Formation Technology for SUB-15NM FinFET With Elevated Source/Drain Extension" Electron Devices Meeting, IEDM Technical Digest. IEEE International. Dec. 2005. (4 Pages).

Kedzierski, J., et al. "Extension and Source/Drain Design for High-Performance FinFET Devices" IEEE Transactions on Electron Devices, vol. 50, No. 4. Apr. 2003. pp. 952-958.

Kranti, A., et al. "Source/Drain Extension Region Engineering in FinFETs for Low-Voltage Analog Applications" IEEE Electron Device Letters, vol. 28, No. 2. Feb. 2007. pp. 139-141.

Matsukawa, T., et al. "Impact of Extension and Source/Drain Resistance on FinFET Performance" 2008 IEEE International SOI Conference Proceedings. Tech. Dig. on 2008 IEEE International SOI Conference. Oct. 2008. pp. 159-160.

* cited by examiner

FIG. 14

FABRICATION OF FIELD-EFFECT TRANSISTORS WITH ATOMIC LAYER DOPING

BACKGROUND

1. Technical Field

The present invention relates to semiconductor devices, and more particularly, to devices and fabrication methods that utilize atomic layer doping techniques.

2. Description of the Related Art

Throughout the evolution and advancement of computing devices, reducing their size and their power consumption while maintaining a high processing capacity have long been design goals. Transistors have been the cornerstone of electrical circuits of computing devices. A common transistor type is field-effect transistors (FET), in which the conductivity of a channel between terminals of the transistor is dependent on electric fields. Basic elements of an FET include a gate, a source and a drain, which are connected to conductive lines that control their operation through contacts. Planar FET transistors, which have been widely used in integrated circuits for the past several decades, were found to be increasingly inefficient on the nanometer scale. Reducing the size of the channel between the terminals of planar transistors to this scale leads to an inefficient leakage of current in the off-state of the transistor, resulting in an increase in power consumption in its idle state. Multiple gate field-effect transistors (MuGFET) have been developed to address this problem, as they incorporate several gates that surround the channel between a source and drain terminal of the transistor on a plurality of surfaces, thereby enabling the suppression of leakage current in the off-state.

There are several different types of multigate devices. FinFETs and Trigate devices are two examples. FinFET devices include a thin fin, which can be made of silicon, that provides the channel between a source and a drain. The fin can be overlaid with one or more pairs of gates, where the gates in a pair are on opposing sides of the fin. Trigates are similar to FinFETs in that they also employ fins. However, in a Trigate device, two vertical gates respectively envelope two separate fins and a single top gate is overlaid on the two vertical gates. The top gate usually extends across a plurality of transistor cells in trigate devices.

SUMMARY

One embodiment is directed to an atomic layer doping method. In accordance with the method, a semiconducting surface and a dopant gas mixture are prepared. Further, a dopant layer is grown on the semiconducting surface by applying the dopant gas mixture to the semiconducting surface under a pressure that is less than 500 Torr and a temperature that is between 300° C. and 750° C. The dopant layer includes at least $4 \times 10^{20}$ active dopant atoms per $cm^3$ that react with atoms on the semiconducting surface such that the reacted atoms increase the conductivity of the semiconducting surface.

Another embodiment is directed to a method for forming a field effect transistor. In the method, a gate structure including a gate dielectric and gate electrode is formed. Source and drain regions are fabricated by forming semiconducting material within recesses that are on opposing sides of the gate structure. Further, an atomic layer doping process is applied over at least one of the source and drain regions to form at least one dopant monolayer over at least one of the recesses of the source and drain regions. In addition, a silicide layer is formed over the at least one dopant monolayer to generate a contact to at least one of the source and drain regions.

An alternative embodiment is directed to a multigate field-effect transistor device. The device includes a gate structure and at least one fin. The gate structure envelopes a plurality of surfaces of one or more fins, which are above a substrate. The fin provides a channel between a source and the gate structure and between a drain and the gate structure. In addition, the fin is composed of a semiconducting material and a dopant layer that conformally overlays the semiconducting material in three-dimensions. Further, the dopant layer includes at least $4 \times 10^{20}$ active dopant atoms per $cm^3$ that are bonded with atoms on a surface of the semiconducting material such that bonding between the active dopant atoms and the atoms on the surface of the semiconducting material increases the conductivity of the surface of the semiconducting material.

Another embodiment is directed to a field-effect transistor device. The device includes a gate structure, a source region, a drain region, at least one monolayer and at least one silicide layer. The gate structure includes a gate dielectric and gate electrode. The source region is includes a semiconducting material that is at least partially within a first recess that is connected to the gate structure via a first channel extension. The drain region is includes a semiconducting material that is at least partially within a second recess that is connected to the gate structure via a second channel extension. One or more monolayers of dopant material formed in accordance with an atomic layer doping process is disposed over at least one of the source and drain regions. At least one silicide layer is disposed over the at least one monolayer above at least one of the source and drain regions.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures, wherein.

DETAILED DESCRIPTION OF PREFERRED EMBODIMENTS

One of the most important problems in scaling down complementary metal-oxide semiconductor (CMOS) transistors is the ability to control transistor leakage current (Ioff) while increasing the drive current (Ion). Fully depleted devices, such as extremely thin silicon on insulator (ETSOI) field-effect transistors (FET), Trigate transistors and Fin-FETs, which can have a sub-threshold slope approaching a theoretical value of 60 mV/dec, may be good candidates to address the problem. While these devices offer excellent short channel effect (SCE) control, they suffer from high extension resistance that degrades the transistor performance.

For example, Trigate and FinFET transistor extensions are typically fabricated by performing ion implantation of either n or p-dopants. However, ion implants amorphize the silicon fin. In addition, the fin cannot be re-crystallized by rapid thermal anneal due to the small, available silicon seed surface area. Thus, the device is formed with a high extension resistance. Furthermore, ion implants cannot effectively cover the three-dimensional area of the fin. Although, selective in-situ doped epitaxial growth should cover the three-dimensional fin effectively, the process also causes a high fin extension resistance, as the resultant dopant concentration is extremely low—between $1\times10^{20}$ atoms/cm$^3$ to $3\times10^{20}$ atoms/cm$^3$. Moreover, if activation annealing is utilized to increase the concentration, then device punch-through will likely ensue.

Exemplary embodiments address the problems associated with fabricating an extension that has a low extension resistance and that has consistent dopant coverage over its three-dimensional surface by employing a novel atomic layer doping (ALDo) procedure. The present ALDo procedure described herein provides a surface with a low resistivity due to a high concentration of active doping agents that result from particular reaction conditions employed. A delta layer formed as a result of ALDo with these materials and conditions shares a common and cohesive lattice structure with the surface on which it is formed. As described in more detail herein below, the reaction conditions, in particular, the low pressure conditions, employed permit a substantially larger number of active dopant atoms to be situated and properly positioned on a semiconducting surface to react with silicon atoms. In particular, embodiments of the present principles can achieve an active p-type dopant concentration of at least $1\times10^{21}$ atoms/cm$^3$ and an active n-type dopant concentration of at least $4\times10^{20}$ atoms/cm$^3$, which is significantly higher than concentrations of active dopant atoms that are achievable in accordance with known methods.

Moreover, the ALDo process can be employed to address problems associated with other types of FETs. For example, one problem with fabricating planar FETs is a phenomenon in which a silicide used to form contacts for the source and drain terminals bulges into the stressors of the terminal, thereby restricting the compressive stress provided by the stressors. As a result, the conductivity between the stressor and the channel is reduced. In accordance with exemplary embodiments, an ALDo layer can be formed over a stressor recess to confine the silicide above it and ensure that the compressive stress provided by the stressor is maintained and that the conductivity between the stressor and the channel is not diminished. Furthermore, as described in more detail below, the ALDo process can be employed to form the silicide relatively close to the gate of the FET and over a significant portion of the extension to the source or the drain terminal. As compared to conventional means of fabricating the extension, forming the silicide close to the gate substantially improves the conductivity of the extension, resulting in increased switching and processing speeds of the circuit in which the FET is implemented.

Aspects of the present invention are described below with reference to flowchart illustrations and/or block diagrams of methods, apparatus (systems) and devices according to embodiments of the invention. The flowchart and block diagrams in the Figures illustrate the architecture, functionality, and operation of possible implementations of methods, apparatus (systems) and devices according to various embodiments of the present invention. It should also be noted that, in some alternative implementations, the functions noted in the block may occur out of the order noted in the figures. For example, two blocks shown in succession may, in fact, be performed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose systems that perform the specified functions or acts.

It is to be understood that the present invention will be described in terms of a given illustrative architecture having a substrate; however, other architectures, structures, substrate materials and process features and steps may be varied within the scope of the present invention.

It will also be understood that when an element described as a layer, region or substrate is referred to as being "on" or "over" another element, it can be directly on the other element or intervening elements may also be present. In contrast, when an element is referred to as being "directly on" or "directly over" another element, there are no intervening elements present. Similarly, it will also be understood that when an element described as a layer, region or substrate is referred to as being "beneath" or "below" another element, it can be directly beneath the other element or intervening elements may also be present. In contrast, when an element is referred to as being "directly beneath" or "directly below" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip including the fin-based multigate devices of the present principles may be created in a graphical computer programming language, and stored in a computer storage medium (such as a disk, tape, physical hard drive, or virtual hard drive such as in a storage access network). If the designer does not fabricate chips or the masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of lithographic masks, which typically include multiple copies of the chip design in question that are to be formed on a wafer. The lithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 1:
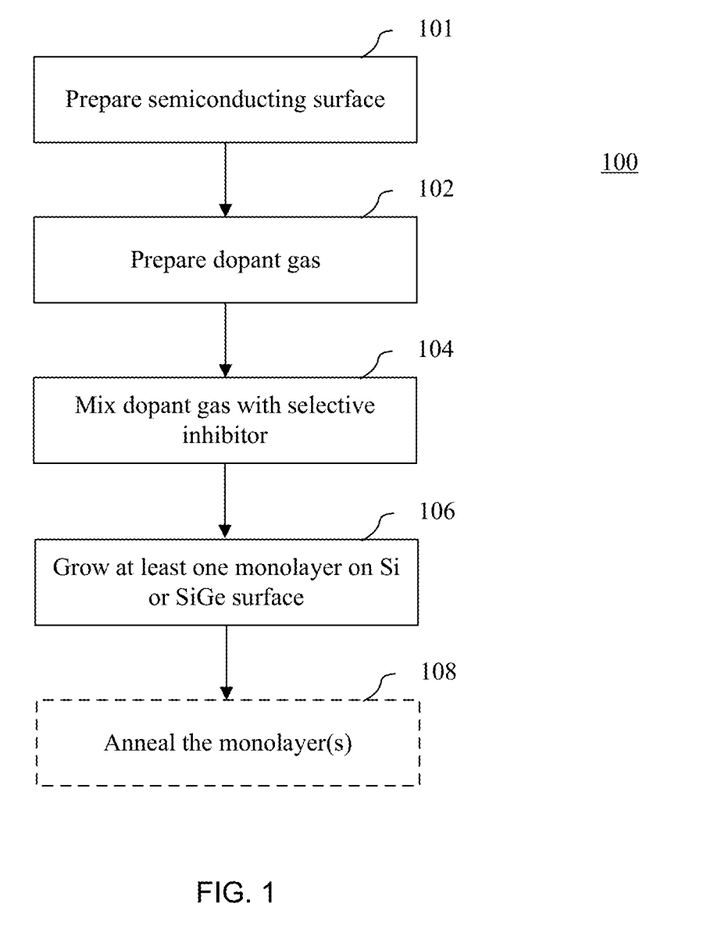
FIG. 1 is a high-level block/flow diagram of an atomic layer doping method embodiment.

Referring now to the drawings in which like numerals represent the same or similar elements and initially to FIG. 1, a novel atomic layer doping method in accordance with an exemplary embodiment of the present invention is illustrated. The method 100 can begin at steps 101 and 102, at which a semiconducting surface, such as, for example, a surface of a substrate or device element made of Si or SiGe, and a dopant gas can be prepared, respectively. For example, diborane gas (for p-type) or phosphine gas (n-type) can be prepared. A preferable flow range of diborane gas is about 10 to 100 sccm (standard cubic centimeters per minute) and 1 to 100 SLM (standard liters per minute) flow of $H_2$ or helium can be used as a carrier gas. For the phosphine gas example, 10 to 100 sccm of Phosphine in 1 to 100 SLM of $H_2$ or He is preferred.

At step 104, the dopant gas can be mixed with a selective inhibitor. For example, the dopant gas can be mixed with 10 to 250 sccm of hydrochloric acid at a specific pressure of 3 to 100 torr and at a temperature range of 350° C. to 750° C. Alternatively, the dopant gas can be mixed with 5 to 100 sccm of dichlorosilane and 10 to 250 sccm of Hydrochloric acid at a specific pressure of 3 to 100 torr and at a temperature range of 350° C. to 750° C.

At step 106, a selective atomic layer dopant growth process can be performed in a reaction chamber to grow one or more monolayers of the resultant mixture of step 104 on a semiconductor surface, such as, for example, an Si or SiGe surface. In accordance with one exemplary implementation, to achieve the low resistivity properties of the dopant monolayer described herein, the growth process should be conducted at a pressure of under 500 Torr, preferably between 7 Torr and 50 Torr, at a temperature of between 300° C. to 750° C., preferably 300° C. to 600° C. In one example, an ALDo B and SiGe matrix can be grown using 5 to 100 sccm of Dichlorosilane and 10 to 250 sccm of hydrochloric acid at 3 to 100 torr and temperature of 350° C. to 750° C. For SiGe matrix growth, 100 sccm of Germane gas can be mixed with 150 sccm of dichlorosilane and 110 sccm of hydrochloric acid at a temperature of 600° C. and a pressure of 10 torr. Rapid thermal chemical vapor deposition (RTCVD) can be employed to implement step 106.

As described in more detail herein below, the growth process can be used to cover the three-dimensional surface of an extension of a Trigate or a FinFET device in a conformal manner. In one example, for p-type FET (PFET) multigate devices, using the preferred ranges described above, one or more monolayers of p-type doping material based on boron are mostly active as deposited with a dopant concentration of, for example, $1\times10^{22}$ atoms/cm$^3$ with at least $1\times10^{21}$ atoms/cm$^3$ Boron activated. In another example, for n-type FET (NFET) multigate devices, monolayers of n-type doping material based on phosphorous are greater than 60% active after annealing (at step 108, below) with a dopant concentration of, for example, $1\times10^{21}$ atoms/cm$^3$. In this example, at least $4\times10^{20}$ phosphorous atoms/cm$^3$ of can be activated, post-annealing, using the processes described herein.

At step 108, the monolayers can optionally be annealed. The annealing process can be performed here to activate remaining n-type or p-type inactive dopants that were grown in accordance with step 106. Rapid Thermal Anneal (RTA) or laser spike annealing (LSA) can be employed to implement the annealing step 108. For example, Rapid Thermal Annealing is preferable at a temperature of between 900° C. to 1060° C. and at atmospheric pressure (i.e., 760 torr). RTA acts to diffuse the dopant within the semiconductor. In accordance with another example, LSA at can be performed at 1250° C. The doping atoms are, in general, not diffused or diffused slightly as a result of LSA.

It should be noted that at step 106, and also at step 108 if performed, one or more ALDo monolayers can be formed as a result of reactions between active dopant atoms, which can be boron or phosphorous, atoms on the semiconductor surface, such as silicon or silicon-germanium, on which the dopant monolayers are grown. As indicated above, the materials and processes used result in a substantial amount of active dopant atoms available for reaction with silicon atoms. Active dopant atoms here should be understood to mean dopant atoms that react with silicon atoms and that thereby contribute to electrical conductivity of the final delta monolayer(s). For example, in the case of using silicon as the semiconducting surface and using B or P as the dopant, a lower resistivity, or higher conductivity, is only achieved if silicon atoms are bonded with dopant atoms, e.g. Boron or Phosphine to form Si—B or Si—P—Si. The delta monolayers formed in accordance with the present processes have a significantly lower resistivity than delta monolayers formed from conventional delta processes due to the higher concentration of active doping atoms achieved using the reactive conditions described above. In particular, the preferable pressure ranges described above permit a larger number of dopants to fall onto the particular silicon atoms on the surface of the semiconductor and to react therewith to increase the conductivity of the surface. As noted in the examples provided above, an active p-type dopant concentration of at least $1\times10^{21}$ atoms/cm$^3$ that react with silicon atoms can be achieved as a result of the deposition step 106. In addition, an active n-type dopant concentration of at least $4\times10^{20}$ atoms/cm$^3$ that react with silicon atoms can be achieved as a result of the annealing step 108. These active dopant concentrations are substantially higher than achievable active dopant concentrations of known methods. For example, known methods may achieve a similar overall dopant concentration. However, the reaction conditions applied in known methods do not properly situate a comparable number of dopant atoms on a semiconductor surface in positions that permit a relatively large number of dopant atoms to react to the silicon atoms. Thus, the present principles provide a substantial improvement in conductivity of a semiconducting surface.

Figure 2:
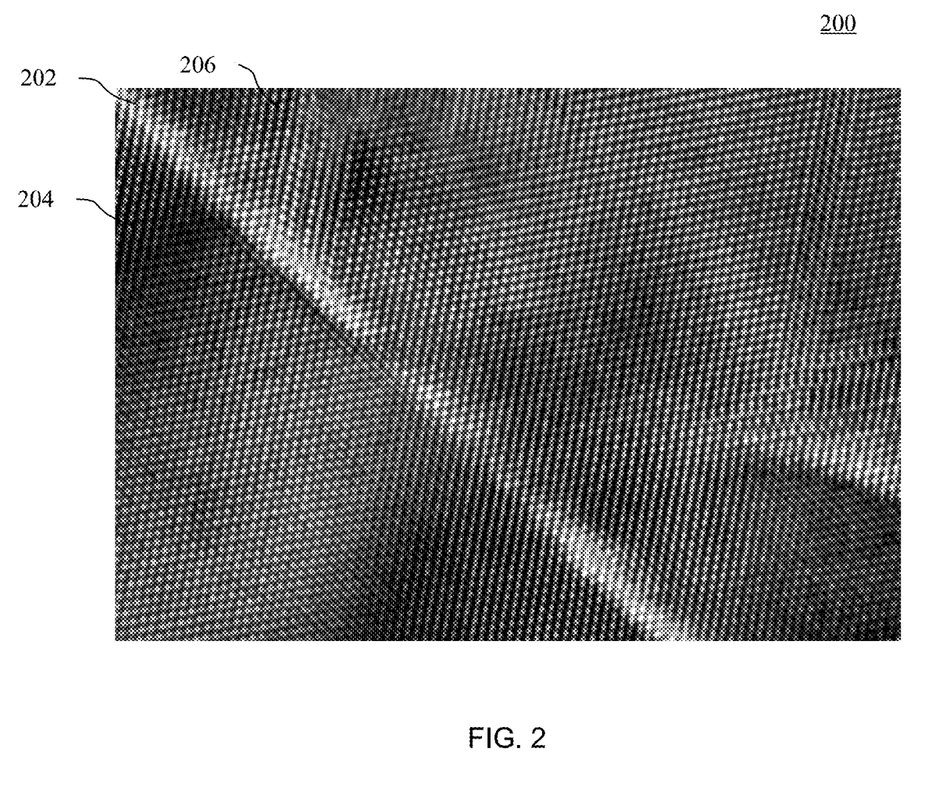
FIG. 2 is a diagram illustrating the lattice structure of an atomic layer dopant monolayer in accordance with an exemplary embodiment.

FIG. 2, provides an example of the delta monolayers 202 formed with a boron dopant on a silicon-germanium surface in accordance with the method 100. The method 100 can be repeated such that multiple delta monolayers are formed. Here, the delta monolayers 202 were formed on two SiGe layer 204 and 206 surfaces. As illustrated in FIG. 2, the lattice structure of the delta monolayers 202 match and are consistent with the lattice structure of the SiGe layers 204, 206. In particular, the delta monolayers 202 and the SiGe layers are part of a common and cohesive lattice structure, thereby permitting the low resistivity qualities of the delta monolayers. In contrast, doping of fins in Trigate and FinFET devices using known methods, such as ion implantation, does not result in a consistent lattice structure between doping atoms and the Si or SiGe fin. As such, the amorphous qualities of these doped fins render the resistivity of the fins to be relatively high, as noted above.

Referring now to FIGS. 3-10, with continuing reference to FIG. 1, an exemplary method 300 for forming a Trigate device in accordance with an exemplary embodiment of the present invention is illustrated. However, it should be understood that the description of the formation of a Trigate device is only one example and that the ALDo process described with respect to the fin in the formation of the Trigate device in the method 300 can be applied to fins of FinFET devices and fins in any type of Multigate devices. Furthermore, FIGS. 4-8 depict intermediate processing steps in the formation of a Trigate device to illustrate the application of the ALDo process. Preliminary and post-processing steps in the formation of Trigate devices can be performed in accordance with known methods and their depiction in the drawings is omitted for purposes of brevity.

Figure 3:
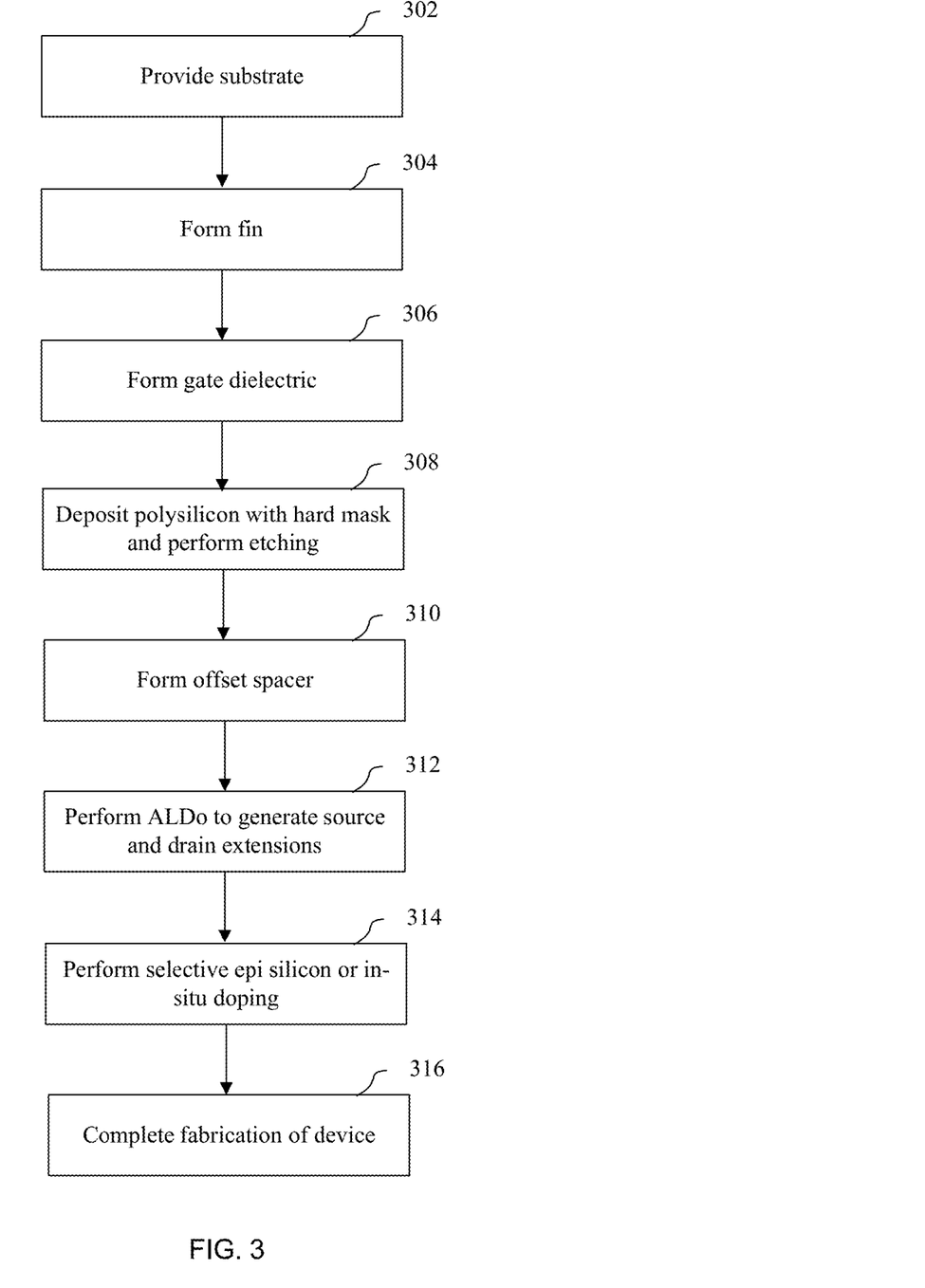
FIG. 3 is a high-level block/flow diagram of an embodiment of a method for fabricating a multigate device.
Figure 4:
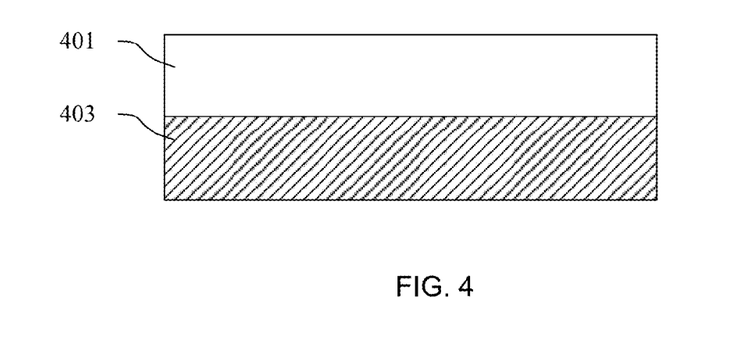
FIGS. 4-8 are block diagrams of elements of a trigate device in accordance with exemplary embodiments.
Figure 5:
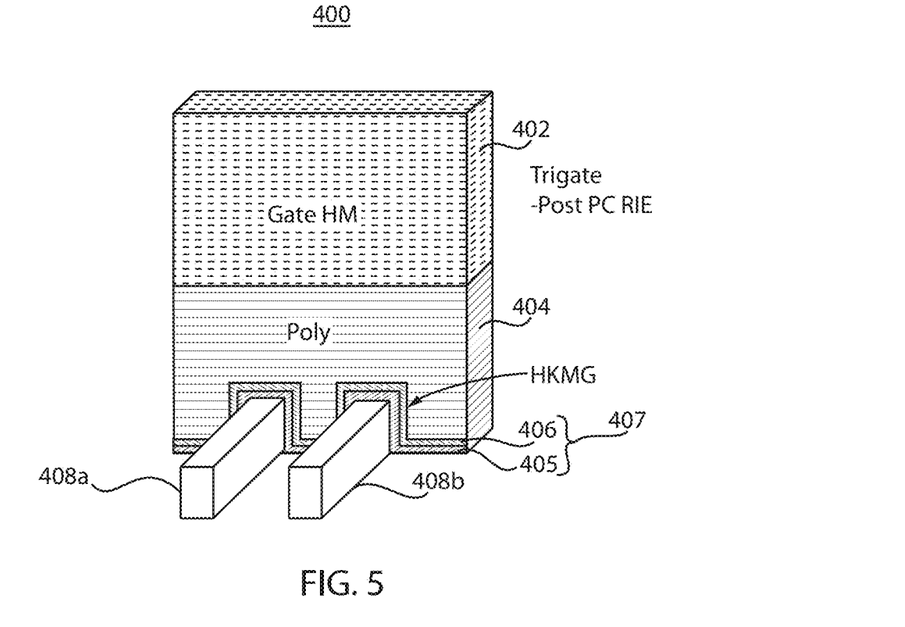

The method 300 can begin at step 302, at which a substrate can be provided. For example, a substrate can be composed of a semiconductor layer, such as a Si or SiGe layer, and a dielectric layer, for example, a buried oxide (BOX) layer, beneath the semi-conducting layer. For example, the substrate can be a semiconductor on insulator (SOI) substrate. FIG. 4 illustrates a substrate with a semiconducting material layer 401 and an insulator layer 403, such as a BOX layer. It should be noted that, although the embodiments described herein below are described with respect to an SOI substrate, the fins formed herein below can be formed using different substrates. For example, the substrate can be a bulk semiconductor, such as Si or SiGe.

At step 304, one or more fins 408a and 408b can be formed. For example, in one implementation, a photoresist mask can be applied in accordance with photolithographic techniques to the semiconducting layer 401, which can be composed of, for example, Si or SiGe, to denote the positioning of fins on top of the substrate. Further, etching processes can be performed to generate the fins on the desired scale. According to one exemplary aspect, the fins 408a and 408b can be dimensioned on the substrate to have a height (or thickness) of 30 nm and a width of 10 to 15 nm. Here, in this example, the Si or SiGe fins can be constructed such that they are the only structures remaining on the exposed insulator layer 403.

At step 306, a gate dielectric 405 can be formed over the top and side surfaces fins 408a and 408b. The dielectric material can be a high-dielectric constant (High-K) film such as zirconate titanate or barium strontium, hafnium or hafnium oxide that is grown or deposited over the fin. Optionally, a metal layer 406 can be deposited over the High-K film to generate a High-K Metal Gate (HKMG) layer. The metal layer can be Titanium nitride, Tungsten, nickel metal.

At step 308, polysilicon 404 can be deposited with a hard mask 402 and etching can be performed to form a trigate structure 400. The polysilicon layer 404 can be dimensioned on the layer 407 to have a height (or thickness) of 10 to 100 nm, a width of 10 to 50 nm, and a length of about 2 microns. In addition, reactive ion etching (RIE) can be performed on the gate layers 402, 404 and 407 to generate the structure 400 depicted in FIG. 5.

Figure 6:
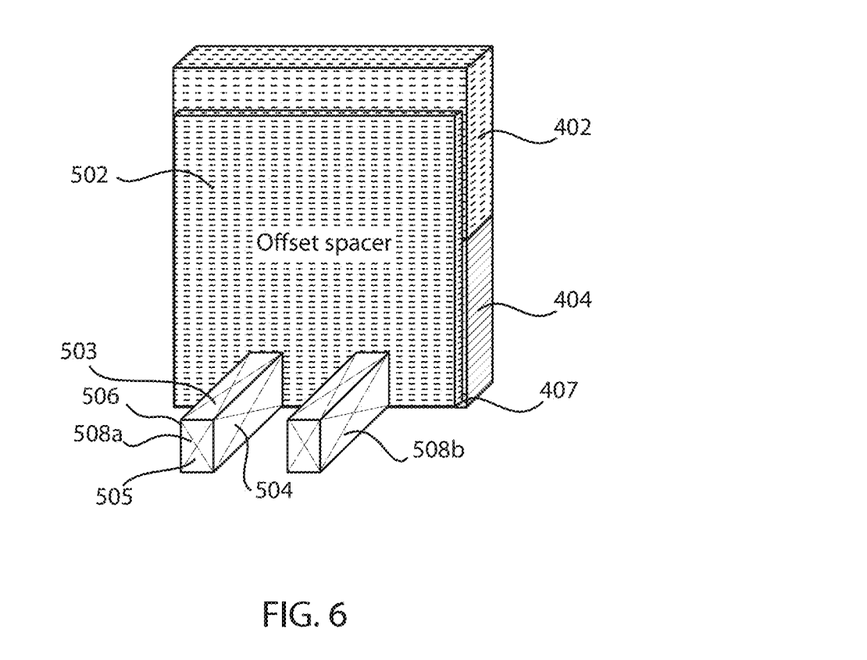

At step 310 an offset spacer 502 is formed on each side of the gate structure. For example, as illustrated in FIG. 6, the offset spacer 502 can be formed to protect the HKMG layer 407 in subsequent processing steps. Here, the offset spacer 502 can be composed of a dielectric material, such as silicon nitride. The offset spacer 502 can be formed by depositing the dielectric material over the gate structure and performing appropriate etching processes.

Figure 7:
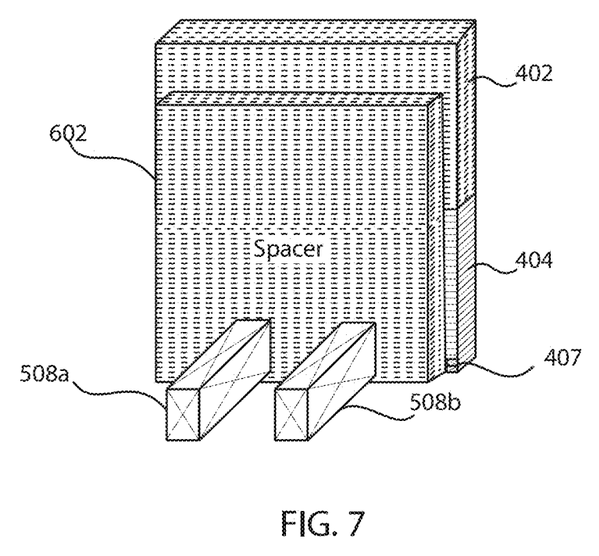
Figure 8:
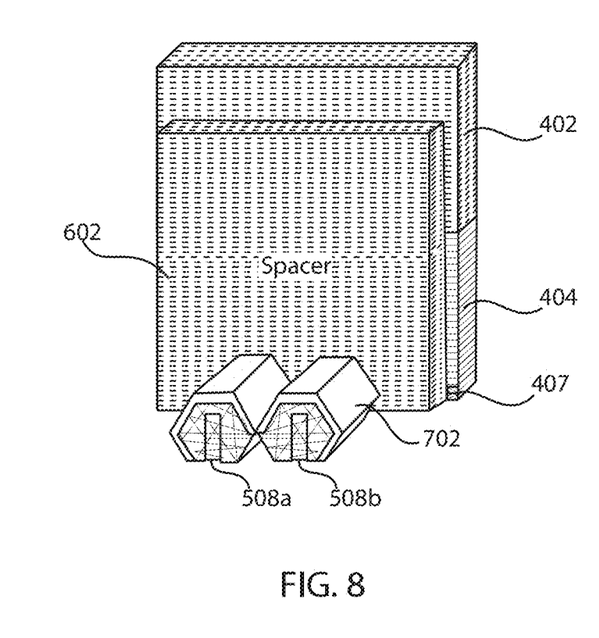

At step 312, the ALDo process 100 can be performed to generate source and drain extensions on the fins. For example, the dopant gases can be prepared as described above with respect to step 102. In addition, the dopant gases can be mixed with HCL, or a similarly suitable material, as described above with respect to step 104 to ensure that the dopants are selectively grown on the Si or SiGe fins 408a and 408b. In addition, at least one dopant monolayer 508a and 508b can be respectively grown on the fins 408a and 408b as described above with respect to step 106 to form one or more delta monolayers. Here, the n-type or p-type monolayers can be conformally grown on the three-dimensional surface of fins 408a and 408b. For example, as shown in FIG. 6, the n-type dopant, e.g., phosphorous, or the p-type dopant, e.g., boron, can be grown on the top 503, side 504, 506 and front 505 surfaces of the fins to a depth of approximately 1.3 nm. The conformal growth that is achievable is a substantial benefit over the use of conventional ion implantation, which results in poor conformality and causes amorphorization of the Si or SiGe fins. In addition, due to the reactive and growth conditions of the ALDo process described above, the dopant monolayers have a significantly high concentration of active dopant atoms. For example, when diborane is employed as the dopant material, a boron concentration of, for example, $1\times10^{22}$ atoms/cm$^3$, which are mostly active as grown, can be achieved. In addition, when phosphine is employed as the dopant material, a phosphorous concentration of, for example, $1\times10^{21}$ atoms/cm$^3$, which are approximately 33% active, can be achieved. As noted above, the high concentration of active dopant atoms and the conformal, three-dimensional growth on the fins is a significant improvement over known ALDo, ion implantation and selective in-situ doped epitaxial growth methods. Further, a spacer forming step can be introduced to form a spacer 602, as illustrated in FIG. 7, by employing RIE. To complete the ALDo process, the monolayers 508a and 508b can be annealed so that remaining inactive dopant atoms are activated and react with the Si or SiGe fins 408a and 408b, as described above with respect to step 108. As indicated above, the annealing step is optional, as additional activation is generally not needed to drive-in dopants to the three dimensional fin-formed extensions because the spacer is extremely thin. The deposition temperature is already sufficient to effect the drive-in. The depth of dopant monolayer on the extension can be controlled by the growing process temperature of step 106 and/or the additional, optional annealing of step 108. As indicated above, a low resistivity of the one or more delta monolayers formed on the fin can be achieved as a result of the ALDo process. Further, because an ultra-thin spacer 502/602 is formed and because of a relatively low process temperature in step 106, and optionally step 108, are applied, the ALDo dopants can react with the fin material under the spacer to overlap the channel.

At step 314, selective epi silicon or in-situ doping can be performed to merge the fins together and form the layer 702.

At step 316, the fabrication of the device can be completed. For example, contacts, vias, metal lines, and/or inter-layer dielectrics, etc. can be formed as is known in the art to complete the Trigate device.

Figure 9:
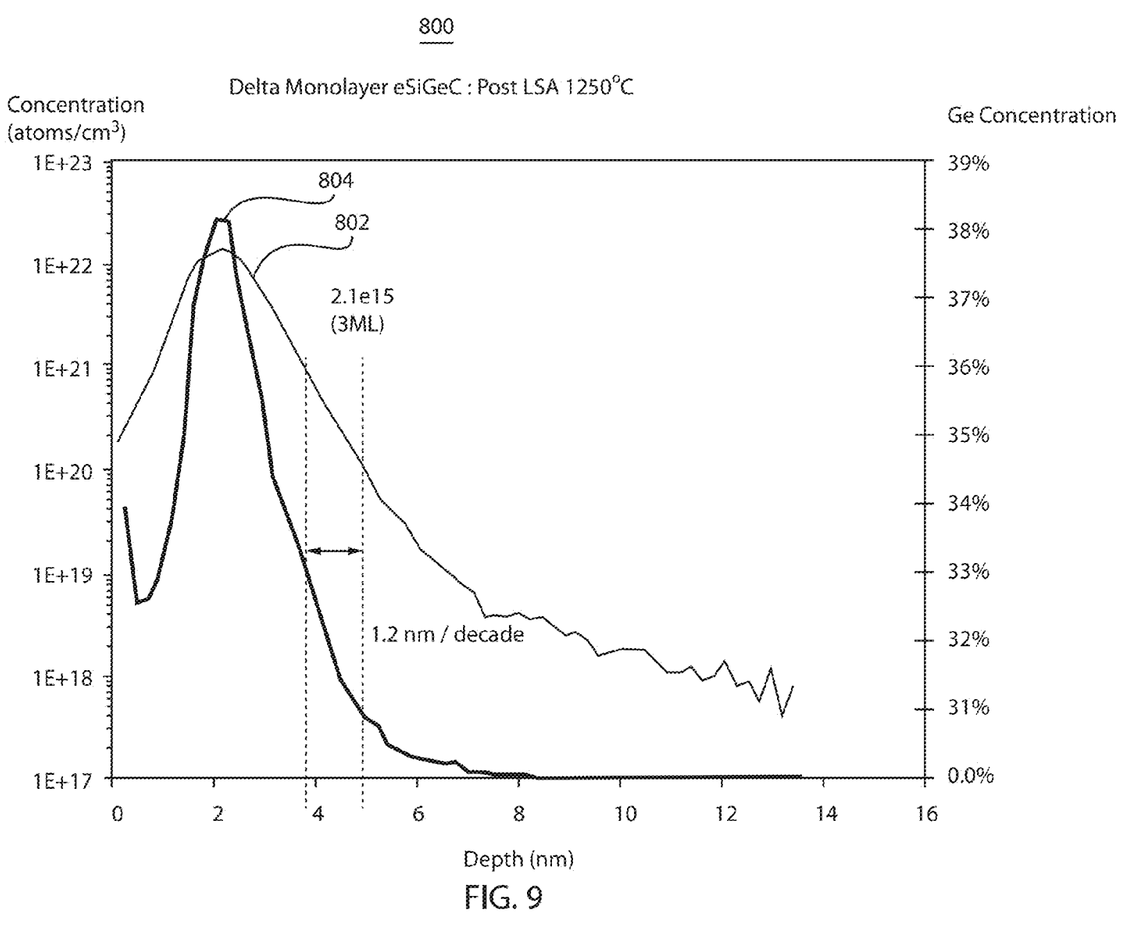
FIG. 9 is a graph illustrating properties of boron monolayers formed in accordance with an atomic layer doping method embodiment.
Figure 10:
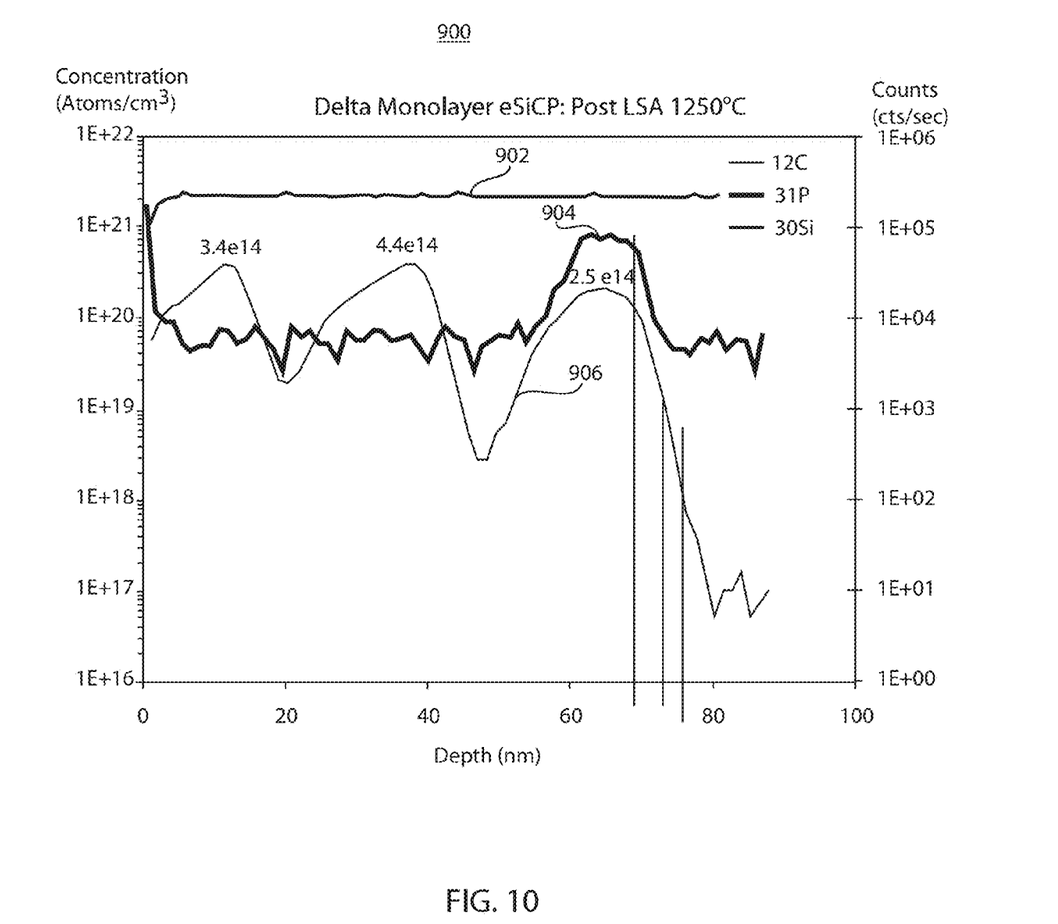
FIG. 10 is a graph illustrating properties of phosphorous monolayers formed in accordance with an atomic layer doping method embodiment.

With reference now to FIGS. 9 and 10, with continuing reference to FIG. 3, plots 800 and 900 illustrating properties of the fins of a trigate device in accordance with the method 300 after the performance of step 308 are provided. In plot 800, the fins were constructed using embedded Si—Ge—C and the annealing was performed at 1250° C. The graph is a plot of boron concentration in atoms/cm$^3$ on the left vertical axis corresponding to the curve 802 v. the depth of the fin structure from the surface of the dopant monolayer in nm on the horizontal axis. The graph also includes a right vertical axis indicating the percentage of Ge on the curve 804 at the corresponding depth of the fin on the horizontal axis. In this example, three monolayers of boron were formed on the SiGe fin surface, with the monolayers of boron having a total thickness of 5 nm with at least one of the boron monolayers having a thickness of 2 nm. The sheet resistance of the delta layers achieved was 168 ohm/sq. The resistivity of the delta layers achieved was $1.6 \times 10^{-5}$ ohm*cm, which had approximately $1.4 \times 10^{21}$ active boron atoms/cm$^3$ (post-LSA), which results in $R_c = 0.5 \times 10^{-8}$ ohm*µm$^2$.

Plot 900 is similar to plot 800. Here, the graph is a plot of concentration in atoms/cm$^3$ on the left vertical axis v. the depth of the fin structure from the surface of the dopant monolayer in nm on the horizontal axis. The graph also includes a right vertical axis indicating the counts per second. In this example, curve 902 corresponds to Si, curve 904 corresponds to carbon and curve 906 corresponds to phosphorous. The sheet resistance of the delta layers achieved in this example was 106 ohm/sq, resulting in a resistivity of $7.4 \times 10^{-4}$ ohm-cm after step 106. In addition, the concentration of active phosphorous atoms after step 106 was $1 \times 10^{20}$ atoms/cm$^3$, which is 33% of active phosphorous atoms as-grown. After LSA performed in accordance with step 308, the sheet resistance achieved was approximately 79 ohm/sq, resulting in a resistivity of $5.5 \times 10^{-4}$ ohm-cm. Further, post-LSA, the concentration of active phosphorous atoms was $2 \times 10^{20}$ atoms/cm$^3$, which is 65% of active phosphorous atoms.

It should be noted that the ALDo processes described herein can be employed to solve other types of problems associated with the fabrication and use of FET devices. For example, with reference to FIG. 11, a PFET device 1000 is illustrated. Although a PFET device is shown here, it should be noted that the principles described here can equivalently be applied to an NFET device. The PFET device in FIG. 11 includes a gate structure 1002 and a recess 1004, which can correspond to a drain or a source of the transistor, and a channel 1008 between the gate 1002. A material with a different lattice structure than the substrate can be formed tin the recess 1004 to impart a stress on the channel 1008 and thereby increase electron mobility in the channel. To form a contact to the drain or the source, a silicide layer 1006 is formed over the source or the drain ten final. However, a problem arises in that the silicide layer 1006 bulges into the recess 1004 of the terminal. For example, the stressor in the recess 1004 may be a compressive stressor while the silicide layer 1006 is a tensile stressor. In this scenario, the bulging of the silicide into the recess material imposes a tensile strain in the stressor material of the recess 1004, which restricts electrons from flowing from the stressor to the channel.

Figure 11:
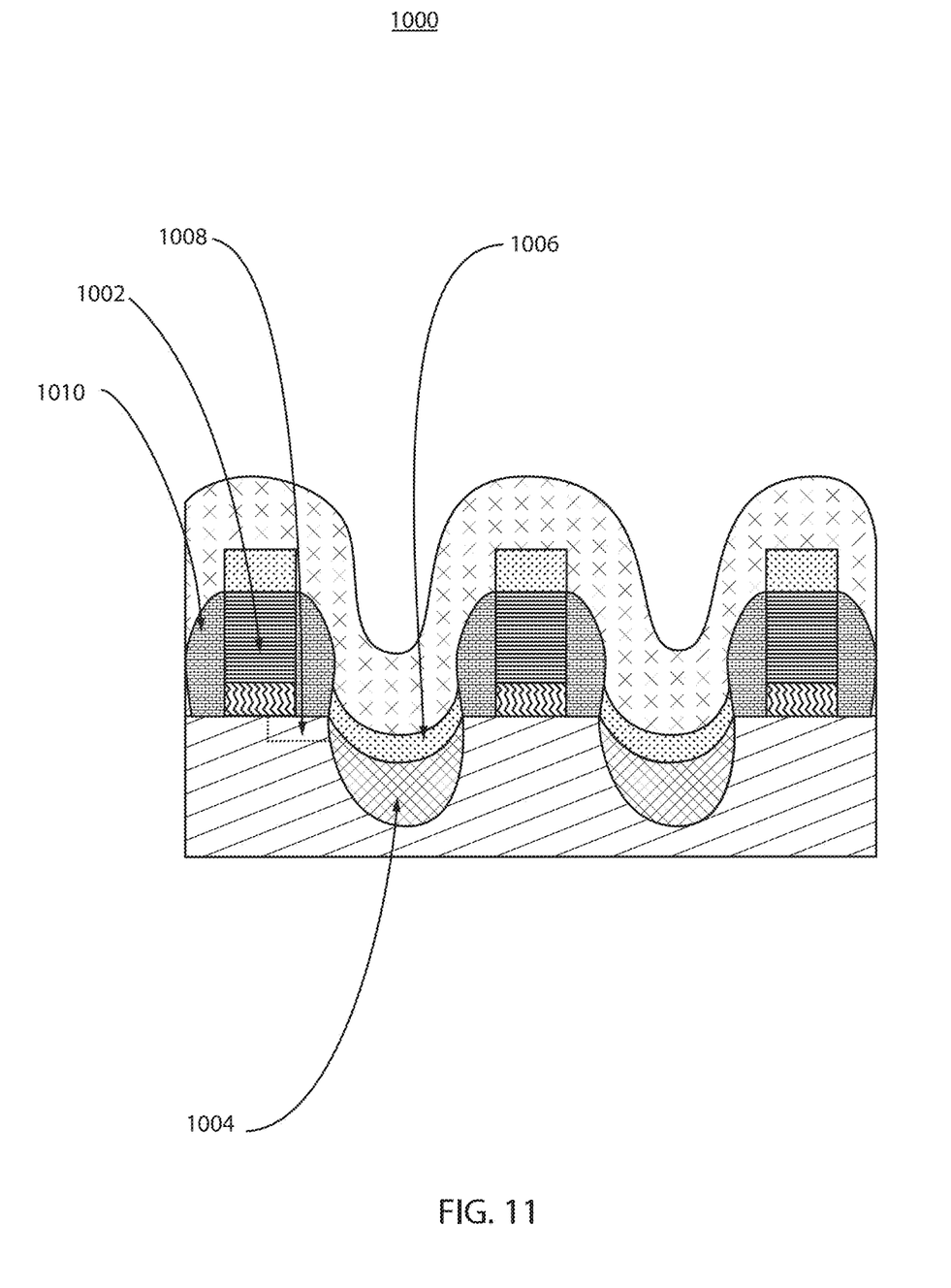
FIG. 11 is a diagram illustrating a field effect transistor.

Another problem associated with these types of devices is that a spacer 1010 is formed around the gate structure 1002 to protect the channel 1008 from the silicide layer 1006. However, the spacer restricts the silicide surface area available for generating a contact between a metal line and the silicide layer. As such, the processing speed of the device is reduced as a result of the spacer 1008. Moreover, the doping of the channel 1008 is relatively low when conventional ion implantation is used.

As described in more detail herein below, the ALDo process described above can be employed to solve these problems. For example, in accordance with one exemplary aspect, the ALDo process can be applied over the channel 1008 and the recess 1004. The inventors have found that the resulting monolayer has a strong resistance to reacting with the silicide layer 1006. For example, a nickel or cobalt silicide does not react with a boron monolayer. As such, the silicide layer 1006 does not bulge into the recess 1004, thereby preserving the compressive stress of the recess stressor material and preventing restriction of the conductivity between the stressor and the channel. Moreover, due to the properties of the ALDo layer, the channel is protected from reaction with silicide. Accordingly, the spacer 1010 need not be used, the available surface area of the silicide to form a contact is increased and the processing speed of the device is faster. In addition, the lower portions of the ALDo layer implements the doping of the channel 1008, which improves the conductivity properties of the channel, as described above with regard to the method 100.

Figure 12:
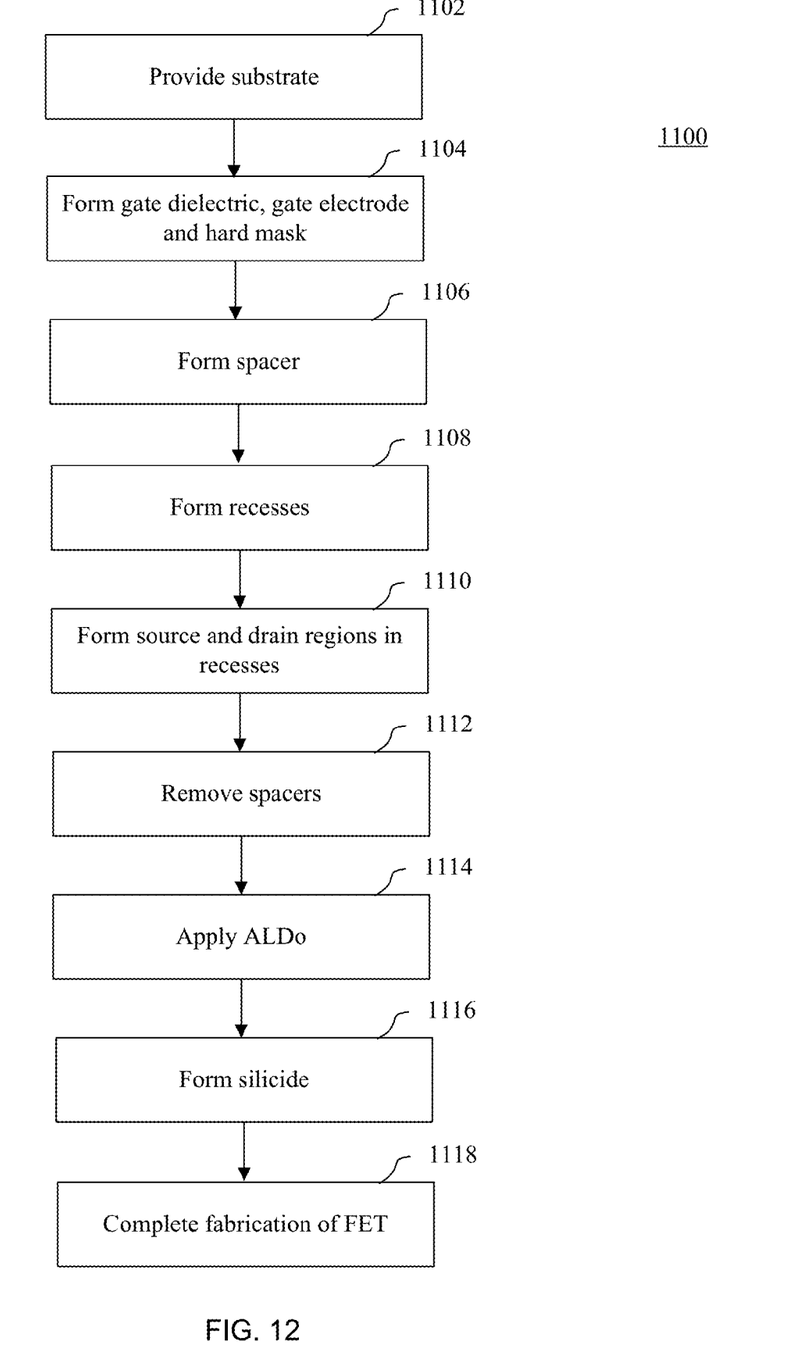
FIG. 12 is a block/flow diagram of an embodiment of a method for fabricating a field-effect transistor device.
Figure 13:
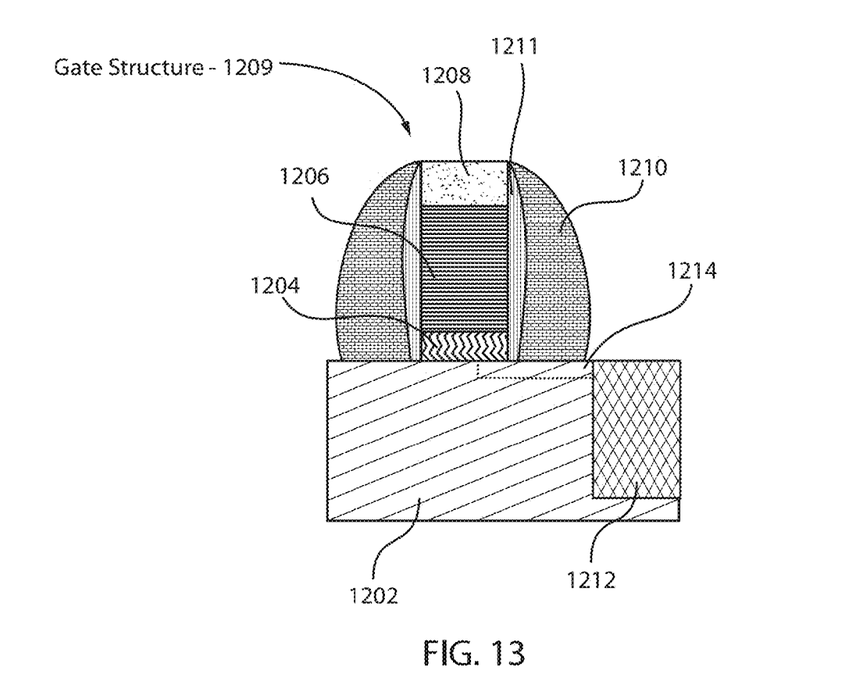
FIGS. 13-14 are block diagrams of elements of a field-effect transistor device in accordance with exemplary embodiments.
Figure 14:
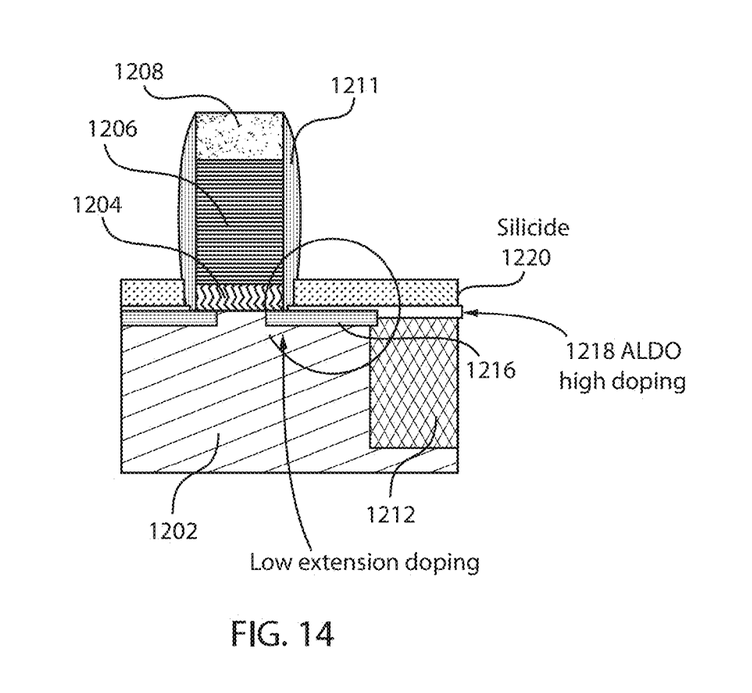

Referring now to FIGS. 12-14, with continuing reference to FIGS. 1 and 11, an exemplary method 1100 for forming a PFET device in accordance with an exemplary embodiment of the present invention is illustrated. However, it should be understood that the description of the formation of a PFET device is only one example and that the ALDo process described with respect to the silicide layer in the formation of the device in the method 1100 can be applied to other types of devices. Furthermore, FIGS. 13-14 depict intermediate processing steps in the formation of a device to illustrate the application of the ALDo process and its effect on the silicide layer. Preliminary and post-processing steps in the formation of the device can be performed in accordance with known methods and their depiction in the drawings is omitted for purposes of brevity.

The method 1100 can begin at step 1102 at which a substrate 1202 can be provided. The substrate can be formed from a semi-conducting material, such as silicon or germanium. At step 1104, a gate structure 1209, including a gate dielectric 1204, a gate electrode 1206 and a gate hard mask 1208, can be formed. The gate dielectric 1204 can be an insulating material, such as silicon dioxide, and the gate electrode 1206 can be polysilicon. The gate structure 1210 can be formed by applying any suitable deposition process and using lithography patterning techniques. In addition, in accordance with one implementation, the gate structure can be approximately 24 nm wide. At step 1106, a spacer 1210 can be formed. The spacer can function as a mask for forming source and drain regions. In addition, a liner 1211 can also be formed to further protect the gate structure 1209. For example, a source or a drain can be formed as element 1212 in FIG. 13. The spacer 1210 material can be silicon nitride and can be formed using plasma etching techniques. At step 1108, recesses 1212 can be formed. The recesses can be formed using appropriate etching techniques. At step 1110, source and drain regions can be formed in recesses 1212. For example, as indicated above, a material with a lattice structure that is different from that of the substrate 1202 can be formed via epitaxial growth within the recesses 1212 to apply a stress to the channel region 1214 and improve the conductivity in the channel region 1214. In accordance with this PFET example, the source and drain regions can be formed with silicon or silicon germanium material. For example, the material can be embedded SiGeC (35%). In addition the source or drain regions in the recess can have a depth of approximately 60 nm. In addition, the source or drain regions can be formed using in-situ doped epitaxial growth or through Ion Beam Sputter Deposition (ISBD). For example, the dopant can be boron or phosphorous dopants in accordance with various implementations. At step 1112, the spacers 1210 can be removed.

At step 1114, the ALDo process 100, with optional annealing, can be applied to the device to generate source and drain extensions. In particular, as illustrated in FIG. 14, the ALDo process can be applied over the extension or the channel 1214 and over the recess 1212 of the source or the drain terminal. Here, the dopant monolayer 1218 of an n-type or a p-type dopant is formed over the recess 1212 and over the channel 1214. For example, in one implementation, the ALDo layer 1218 can be one or more boron monolayers. In addition, the reaction of the dopant and the semiconducting material of the substrate 1202 forms a doped channel 1216 between the recess and the gate structure 1209. As illustrated in FIG. 14, the region 1216 extends beneath the gate structure 109 and beneath the liner 1211. Diffusion of the dopant can be implemented through RTA, as mentioned above. Here, the Aldo monolayer is about 7 Angstroms. As discussed above with regard to the method 100, the resultant doped channel or extension 1216 has substantially improved resistivity properties as compared to ion implantation and to other atomic layer deposition processes.

At step 1116, a silicide layer 1220 can be formed over the ALDo dopant monolayer 1218. It should be noted that, typically, after the extension is doped, using for example ion implantation, another spacer is formed about the gate structure to protect the extension from the silicide formation step. However, here, as indicated above, the spacer is not needed as the ALDo dopant monolayer 1218 adequately protects the extension from the silicide layer. Accordingly, the silicide layer can be formed relatively close to the gate structure 1211 with a wider surface area for contact formation, thereby permitting a faster processing speed of the device. The silicide can be formed by reacting metal with silicon at an elevated temperature so that low resistivity is achieved. The ALDo layer is inert to metal silicidation reaction. A thin semiconductor cap, such as an SiGe or Si cap, can be formed over the ALDo layer for silicidation. The thin semiconductor cap can be silicided with metal to lower the resistivity of the contact. However, this metal silicide cannot penetrate into the ALDo layer, as the ALDo layer is chemically inert with respect to the silicide. In accordance with one exemplary aspect, the silicide layer can be a nickel silicide layer that is formed with a depth of 18 nm. Here, as described above, the bulging of the silicide into the recesses 1212 is prevented by the ALDo dopant monolayer 1218. As such, because the compressive stress of the stressor is preserved, the conductivity properties of the extension between the gate and the source or the drain of the recess 1212 is also preserved.

At step 1118, the fabrication of the FET can be completed. For example, contacts, vias, metal lines, and/or inter-layer dielectrics, etc. can be formed as is known in the art to complete the Trigate device, as is known in the art.

Having described preferred embodiments of fabricating field-effect transistors with atomic layer doping (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An atomic layer doping method comprising:
preparing a semiconducting surface;
preparing a dopant gas mixture; and
growing a dopant layer primarily composed of the dopant on the semiconducting surface by applying the dopant gas mixture to the semiconducting surface under a pressure that is between 7 Torr and 50 Torr and a temperature that is between 300 ° C. and 750 ° C.,
wherein the dopant layer includes at least $4\times10^{20}$ active dopant atoms per $cm^3$ that react with atoms on the semiconducting surface such that the reacted atoms increase the conductivity of the semiconducting surface.

2. The method of claim 1, wherein the dopant layer includes an active p-type atom concentration of at least $1\times10^{21}$ atoms/$cm^3$ as a result of said growing.

3. The method of claim 1, further comprising:
annealing the dopant layer to increase the number of active dopant atoms in the layer.

4. The method of claim 3, wherein the dopant layer includes an active n-type atom concentration of at least $4\times10^{20}$ atoms/$cm^3$ as a result of said annealing.

5. The method of claim 1, wherein the semiconducting surface has a resistivity of less than $10\times10^{-4}$ ohm$^-$ cm.

6. The method of claim 1, further comprising:
mixing the dopant gas with a selective inhibitor to limit the reaction of the dopant gas to the semiconducting surface.

7. The method of claim 1, wherein the dopant atoms of the dopant layer form a common and cohesive lattice structure with the atoms of the semiconducting surface as a result of said growing.

8. A method for forming a field effect transistor comprising:
forming a gate structure including a gate dielectric and gate electrode;
fabricating source and drain regions by forming semiconducting material, which imposes stresses on a channel region to the gate structure, within recesses that are on opposing sides of the gate structure;
applying an atomic layer doping deposition process over at least one of the source and drain regions to form at least one dopant monolayer primarily composed of the dopant over at least one of the recesses of the source and drain regions; and
forming a silicide layer over the at least one dopant monolayer to generate a contact to the at least one of the source and drain regions such that the at least one dopant monolayer is disposed between the silicide layer and the semiconducting material in the at least one of the recesses of the source and drain regions.

9. The method of claim 8, wherein the applying further comprises applying the atomic layer doping deposition process on a channel extension between the gate structure and at least one of the source and drain regions to form at least one dopant monolayer over the channel extension.

10. The method of claim 9, wherein the forming a silicide layer further comprises forming the silicide layer over the channel extension.

11. The method of claim 8, wherein the applying the atomic layer doping deposition process further comprises growing the at least one dopant monolayer by applying a dopant gas mixture to the at least one of the source and drain regions under a pressure that is less than 500 Torr and a temperature that is between 300 ° C. and 750 ° C.

12. The method of claim 11, wherein the at least one dopant monolayer includes an active p-type atom concentration of at least $1\times10^{21}$ atoms/$cm^3$ as a result of said growing.

13. The method of claim 11, wherein the applying the atomic layer doping deposition process further comprises annealing the at least one dopant monolayer to increase the number of active dopant atoms in the at least dopant one monolayer and wherein the at least one dopant monolayer includes an active n-type atom concentration of at least $4\times10^{20}$ atoms/$cm^3$ as a result of said annealing.

* * * * *